(12) United States Patent
Maeding

(10) Patent No.: US 9,509,294 B2
(45) Date of Patent: Nov. 29, 2016

(54) BASELINE RESTORE SAMPLING METHOD

(71) Applicant: Aeroflex Colorado Springs Inc., Colorado Springs, CO (US)

(72) Inventor: Dale G. Maeding, Dana Point, CA (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 14/682,954

(22) Filed: Apr. 9, 2015

(65) Prior Publication Data

US 2016/0301399 A1 Oct. 13, 2016

(51) Int. Cl.
*H03K 5/007* (2006.01)

(52) U.S. Cl.
CPC ................... *H03K 5/007* (2013.01)

(58) Field of Classification Search
CPC ........ H03K 3/0231; H03K 3/26; H03K 5/00; H03K 5/086; H03K 5/135; H03K 4/06; H03K 5/249; H03K 17/162; H03K 17/302
USPC .......... 327/336, 337, 339, 560, 563
See application file for complete search history.

(56) References Cited

U.S. PATENT DOCUMENTS

| | | | | |
|---|---|---|---|---|
| 5,281,860 A * | 1/1994 | Krenik | ................ | G11C 27/026 327/336 |
| 5,371,763 A * | 12/1994 | Ota | .................... | H04B 10/6933 327/72 |
| 6,469,561 B2 * | 10/2002 | Pernigotti | ............. | G01R 19/04 327/336 |
| 8,564,704 B2 * | 10/2013 | Taka | ..................... | H04N 3/155 341/100 |
| 2009/0219129 A1 * | 9/2009 | Denier | ..................... | H03F 1/08 338/25 |

* cited by examiner

*Primary Examiner* — John Poos
(74) *Attorney, Agent, or Firm* — Peter J. Meza; Hogan Lovells US LLP

(57) ABSTRACT

A baseline restore circuit includes a current input for receiving a current pulse having a DC current baseline; a charge amplifier having an input coupled to the current input, and an output referenced to a DC voltage baseline; a feedback baseline restore circuit comprised of a switched capacitor integration circuit having an input coupled to the output of the charge amplifier, and an output coupled to the current input; and a sample control circuit controlling the switched capacitor circuit input to the integrator so that only the reference voltage baseline is sampled. The inputs to the sample control circuit are a window comparator, and a high rate pulse detector, both with inputs from the charge amplifier output.

27 Claims, 6 Drawing Sheets

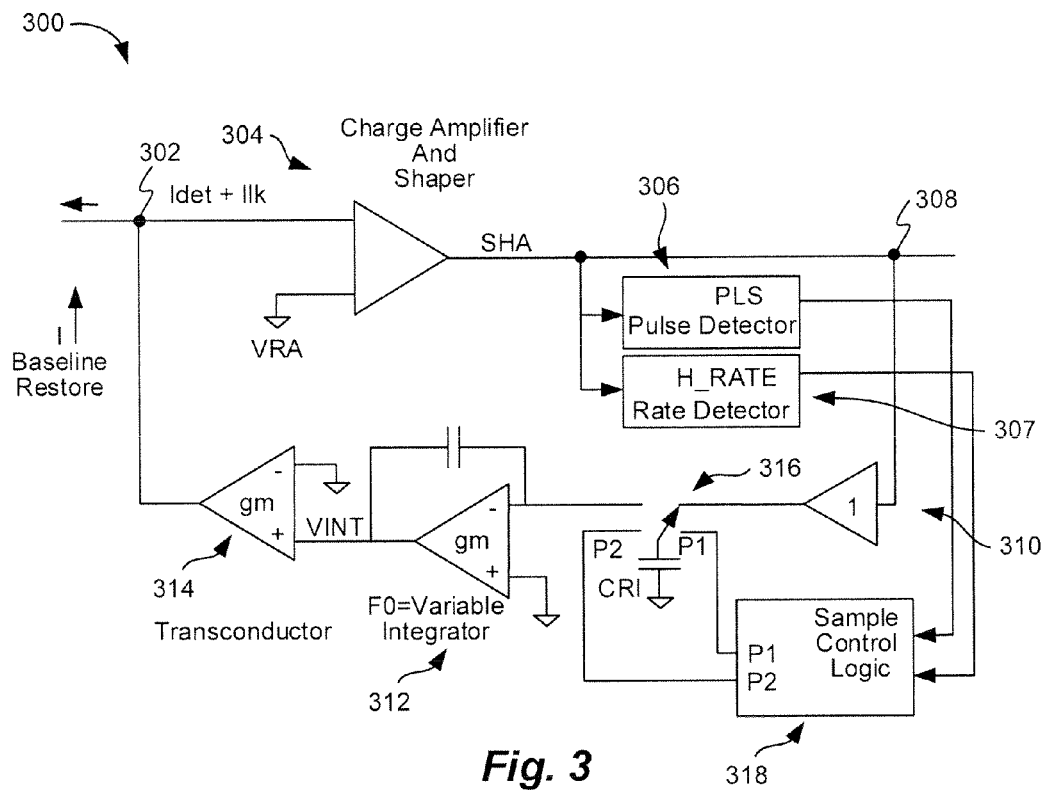
Fig. 3
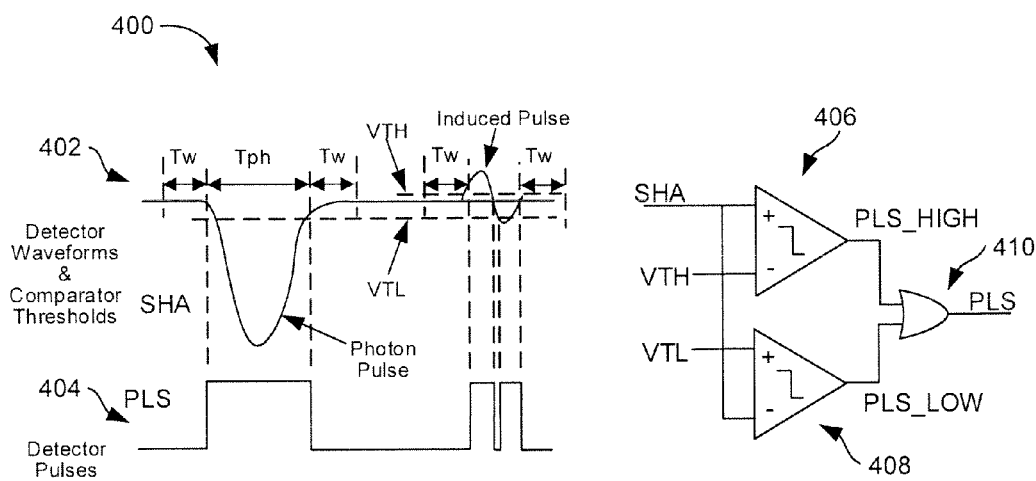
Fig. 4A
Fig. 4B

BASELINE RESTORE SAMPLING METHOD

FIELD OF THE INVENTION

The present invention relates to sampling methods and circuits, and, more particularly, to sampling methods and circuits that accurately correct the baseline voltage of a detected input signal to the reference level at the output of a charge amplifier.

BACKGROUND OF THE INVENTION

Current sampling methods and circuits typically use averaging circuits that can distort the baseline voltage reference of a sampled output signal. This is because sampled pulses are averaged in with the baseline voltage reference level. For example, negative going input pulses can, once averaged, result in the baseline voltage reference being lower than the desired baseline voltage reference level in the output signal. Alternatively, positive going input pulses can, once averaged, result in the baseline voltage reference being higher than the desired baseline voltage reference in the output signal. What is desired is a method and circuit for accurately reproducing the baseline voltage reference level in the sampled output signal without any voltage offsets despite the presence of input pulses.

SUMMARY OF THE INVENTION

According to the present invention a baseline restore circuit comprises a current input for receiving a current pulse having a DC current baseline; a charge amplifier having an input coupled to the current input, and an output with a DC voltage baseline; a switched capacitor circuit having an input coupled to the output of the charge amplifier, and an output; an integrator circuit having an input coupled to the output of the switched capacitor circuit and an output coupled to the current input; and a sample control circuit configured for selectively controlling the switched capacitor circuit so that only the reference voltage baseline is sampled. The switched capacitor circuit comprises a capacitor referenced to the reference voltage baseline in series with two switches. The integrator circuit comprises a variable integrator circuit in series with a transconductance amplifier. The sample control circuit comprises a pulse detector circuit, and a high rate detector circuit. The pulse detector circuit comprises two comparator circuits coupled in parallel and is configured to receive a high threshold voltage and a low threshold voltage. The high rate detector compromises a high pass filter, a comparator, a charge pump circuit, and a comparator. The sample control circuit also comprises a logic circuit. The logic circuit comprises a plurality of retriggerable one-shot circuits. In the baseline restore circuit of the present invention, if a pulse is detected a corresponding sample is discarded.

BRIEF DESCRIPTION OF THE DRAWINGS

FIG. 3 shows a sampled baseline restore circuit block diagram according to the present invention;

FIG. 4A shows detector waveforms and comparator thresholds according to the present invention;

FIG. 4B shows a pulse detector circuit wherein two comparator outputs are ORed together according to the present invention;

DETAILED DESCRIPTION

An objective of the baseline restore circuit according to the present invention is to actively remove any DC or very low frequency offsets from the charge amplifier output. This is because the energy comparator levels are set with respect to a voltage reference level, ("VRA"), as will be explained in further detail below.

Figure 1:
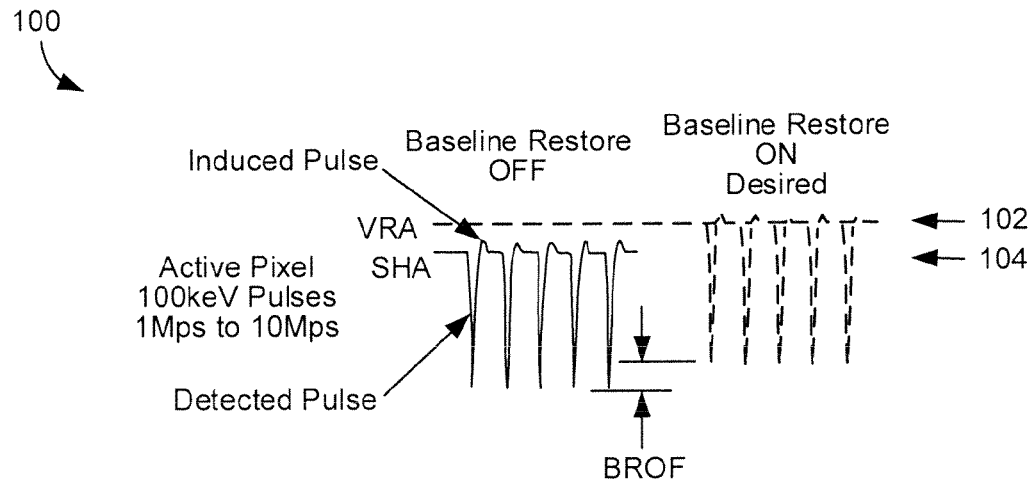
FIG. 1 shows two pulse waveforms with and without the baseline restore on, according to the present invention.

The baseline restore ("BLR") circuit according to the present invention uses a sampling method to obtain a baseline value from the amplifier output. A low frequency feedback loop servos the amplifier's DC output level to the VRA. The voltage waveform whose baseline is to be restored is a negative going pulse that occurs at the charge amplifier's output when a pulse is detected as shown in FIG. 1. Without BLR, the waveform has an offset due to a parasitic DC current from the detector. FIG. 1 shows amplifier signal ("SHA") 104 and a VRA baseline voltage 102 associated with pulses from pixels in a detector. Typical "SHA" pulses in FIG. 1 result from detected photons with an energy of 100 KeV, and a frequency of between 1 and 10 Mps. Also shown in FIG. 1 is a voltage offset designated BROF that shows the voltage offset between the sampled pulse signal with and without the baseline voltage restored. Thus the traces of FIG. 1 show the sampled pulse train with the baseline restore circuitry turned off, and with the baseline restore circuitry turned on conditions. In the desired baseline restore condition, the baseline of the pulse train at SHA and the VRA voltage are identical.

The invention comprises an approach to the baseline restore circuit that can discriminate between the baseline and pulses as is described in further detail below. One of the keys to the approach of the present invention is to insure that the servo loop only samples the SHA output when there are no pulses from photons or induced charges. This is very difficult with continuous time circuits because there is a time delay required between sensing a pulse and eliminating it from the feedback loop. Therefore the pulse corrupts the feedback loop baseline level.

Figure 2:
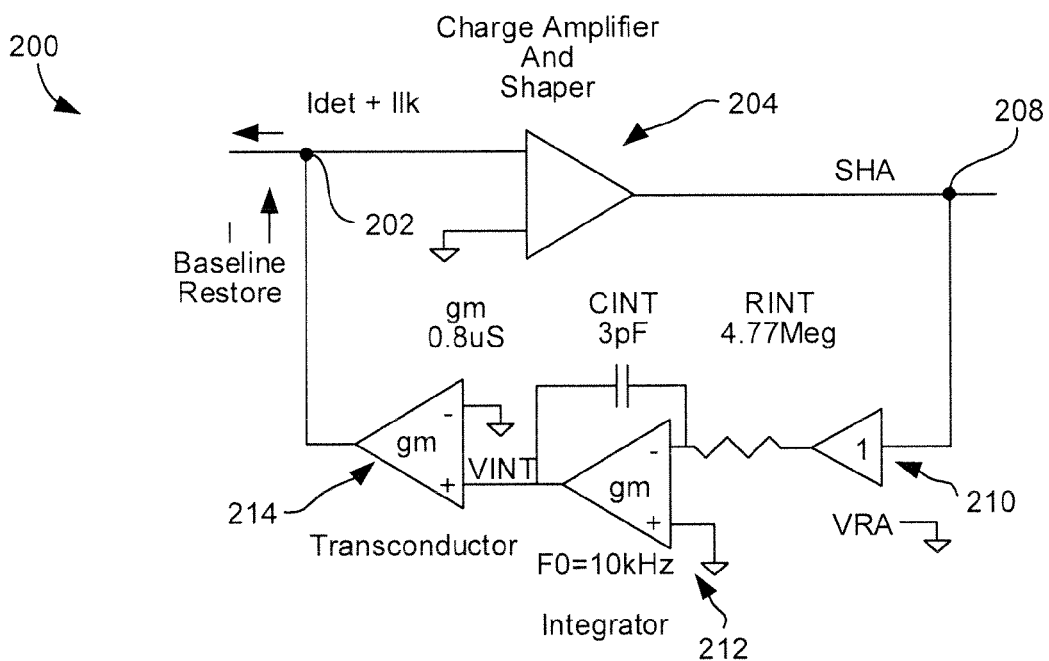
FIG. 2 shows a continuous baseline restore circuit for restoring DC offsets.

A feedback loop that removes the Baseline Offset when no input pulses are present is shown in the circuit 200 of FIG. 2. This circuit forces SHA to have a voltage of VREF. Unfortunately, when pulses are present, the baseline of SHA will shift to the average value of the pulsed SHA output. Circuit 200 includes an input 202 for receiving the charge pulses from a detector (not shown) and a charge amplifier and shaper 204. A feedback loop from node 208 to the input node 202 includes a buffer amplifier 210, an integrator 212, and a transconductance amplifier 214. The integrator 212 includes a capacitor CINT and a resistor RINT.

To solve the problem associated with circuit 200, the continuous time integrator 212 can be replaced with a switched capacitor integrator as shown in circuit 300 of FIG. 3. Additionally a Pulse Detector and Sample Control circuit 318 is used to determine if any occurrences of photon or induced pulses during the switched capacitor sample of SHA took place. If there was a pulse, then the sample will be discarded and an attempt to acquire a new baseline sample will be made. Therefore only the SHA baseline, without detector pulses, will be sampled. A block diagram of the new approach is shown in FIG. 3.

Circuit 300 of FIG. 3 according to the present invention includes an input node 302, charge amplifier and shaping circuits 304, and an SHA node 308 as previously described. The feedback path also includes a buffer amplifier 310, a sampled integrator 312, and a transconductance amplifier 314, substantially as previously described with respect to the circuit 200 of FIG. 2. In circuit 300, the feedback path includes a switched capacitor circuit 316 that is controlled by pulse signals P1 and P2 as is described in further detail below. The P1 and P2 signals are generated by the Pulse Detector 306, High Rate Detector 307, and Sample Control circuit 318 as shown. The switched capacitor circuit includes a capacitor CR1 in series with two switches that connect the capacitor between the output of the buffer amplifier 310 and the input of the variable integrator 312.

A Pulse Detector circuit block 306 is used to determine if there is a positive induced pulse or a photon driven negative pulse greater than a small positive threshold, VTH, or a small negative threshold, VTL, respectively. VTL and VTH are on the order of 10 mV with pulse peaks from a 100 keV photon of approximately 200 mV. The thresholds should be well above/below the circuit noise to avoid triggering on the noise signal. The Pulse Detector waveforms and a simple circuit topology are shown in FIGS. 4A and 4B. The output of the Pulse Detector, PLS, is the OR'ed outputs of the threshold comparators. FIG. 4A shows the pulse detector output signal PLS 404 with respect to the SHA signal 402. The threshold voltages VTH and VTL are also shown in FIG. 4A. FIG. 4B shows the pulse detector circuit including comparators 406 and 408. Comparator 406 receives the SHA signal and the VTH threshold voltage, and comparator 408 receives the SHA signal and the VTL threshold voltage. The outputs of comparators 406 and 408 are coupled together through OR gate 410 to provide the PLS signal as shown.

A High Rate Detector circuit block 307 determines if the rate of pulses exceed a rate of approximately 10 Mps. The details of this block are described below in greater detail with respect to FIGS. 9A-9C.

The Sample Control circuits take advantage of the known shapes of the detected pulses. The Sample Control will have timing circuits that are adjustable and related to the shaper, and induced pulse rise/fall times. The sampling rate can be synchronous based on a chip clock, or asynchronous using clocks generated within a pixel.

Figure 5:
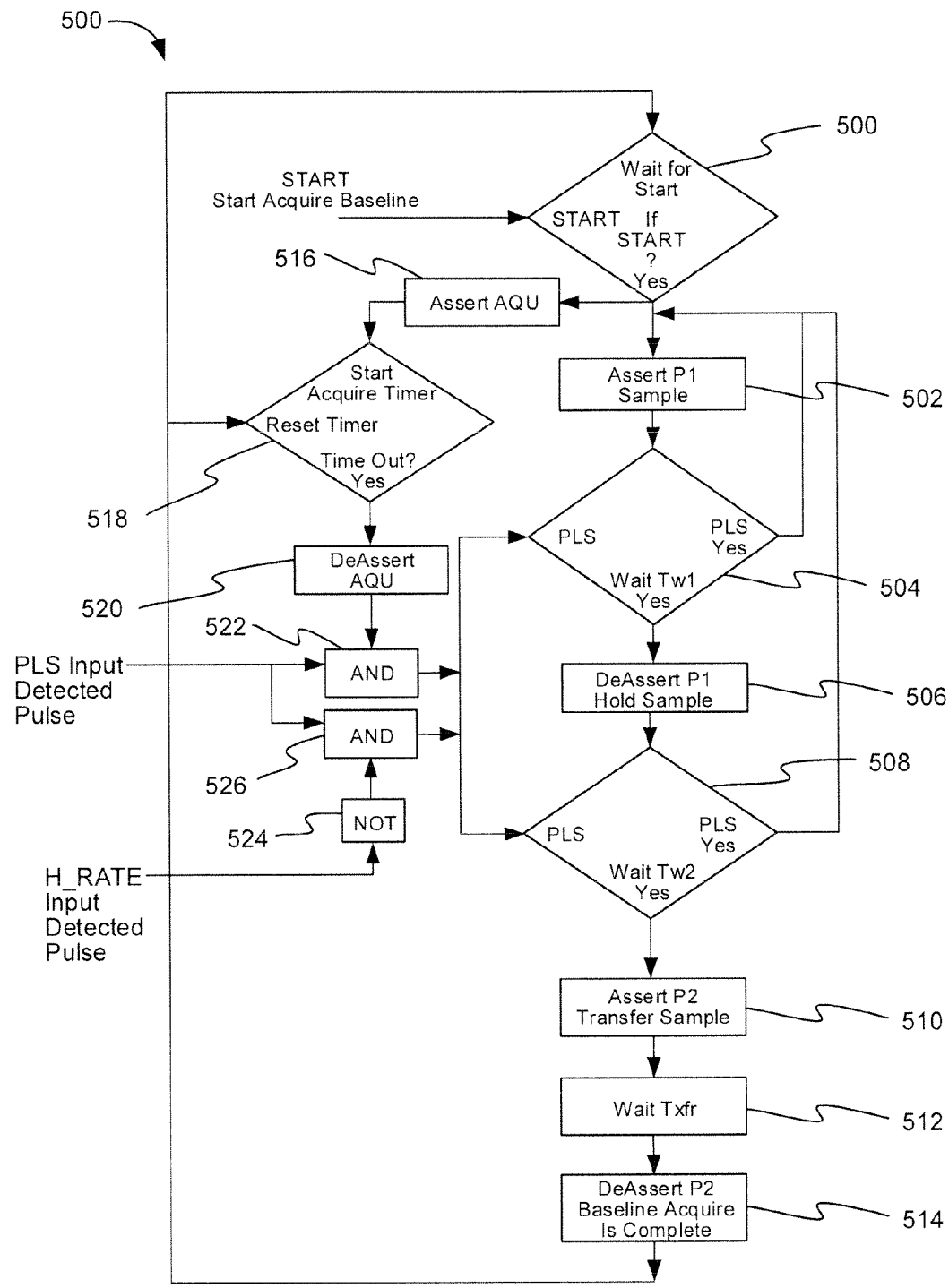
FIG. 5 shows a flow diagram of sample control timing according to the present invention.

The timing of the control logic will be explained with the aid of the timing flow chart 500 shown in FIG. 5. The sample of the baseline is initiated with a "Start" pulse in the flow chart at step 500. The sample pulse, P1, is then asserted at step 502. This action tracks the voltage of SHA with capacitor CR1 as shown in FIG. 3. The flow diagram then shows an "if" decision box 504 that waits Tw1 before proceeding to de-assertion of P1. Tw1 is the "wait" time that assures that any pulse transients decay to values well below the noise level before a sample is taken. If any pulses are detected during the wait time Tw1, P1 stays asserted, and the wait time is reinitialized.

The SHA voltage is held on capacitor CRI when P1 is de-asserted at step 506, and then there is another wait time of Tw2 at step 508 before asserting P2 at step 510, and transferring the held voltage on CRI to the integrator. If however, a detected pulse occurs during this wait period at step 508, the flow chart flow is to reassert P1 and the sample time repeats itself again. A wait step 512 is performed between steps 510 and 514. The conceptual idea is to be sure that there are no pulses detected, that might corrupt the sample voltage, before or after the SHA baseline sample has been taken. P2 is deasserted and the baseline acquisition is complete at step 514.

There will be times when the pulse rates are so high that a "clean" sample never occurs during the time between the Start pulse and the end of the sample period. Therefore there is a parallel branch of the flowchart that starts an Acquire timer that asserts AQU high at step 516. When AQU is asserted the PLS input can flow through AND gate 522 to the decision steps 504, and 508 as is the normal operation. When the Acquire timer times out at step 518, AQU is deasserted step 520. The PLS signal can still flow through the AND step 526, to the decision steps 504, and 508 if the PLS rate is low as determined by the H_RATE input signal and the NOT step 524. If the H_RATE signal is high, steps 524 and 526, will step the PLS input signal to decision steps 504 and 508. Therefore the decision chain comprising steps 504 and 508 will flow down, and the baseline is "Forced" sampled and the signal transfer occurs without interruption. The flow chart then loops back and waits for the next Start pulse.

The timing diagram of the Sample Control logic is shown in FIGS. 6A, 6B, 6C and 6D for four of many possible flow chart transitions.

Figure 6A:
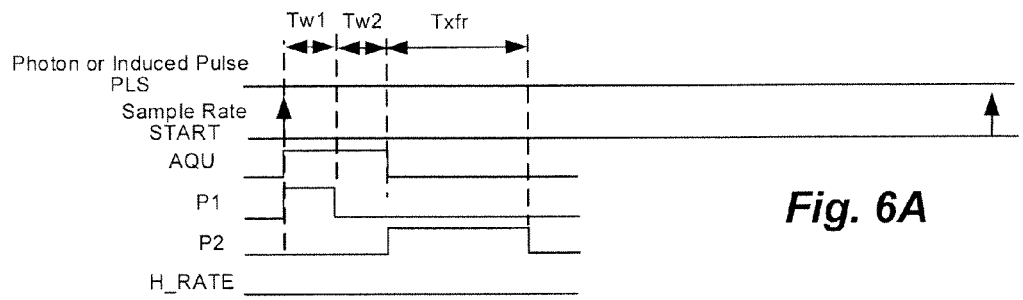
FIGS. 6A, 6B, 6C and 6D show timing diagrams of the sample control logic for four of many possible flow chart transitions according to the present invention.

FIG. 6A shows the case for no detector pulse events taking place during the Baseline sample time.

Figure 6B:
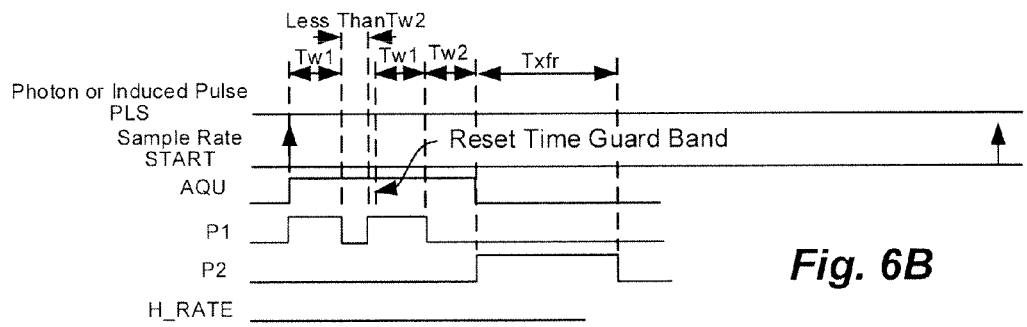

FIG. 6B shows a detector pulse occurring during the wait time period after P1 is asserted. The detector pulse reasserts the P1 sample and wait time Tw1. The baseline is again sampled when P1 transitions low, after a Tw1 period. After no pulses occur during the Tw2 wait period, the sampled baseline voltage is transferred to the integrator when P2 is asserted. The Sample Control then waits for the next Start pulse to take the next sample.

Figure 6C:
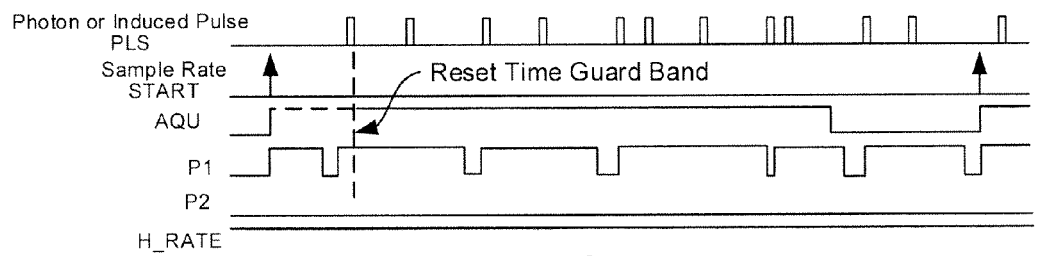

FIG. 6C is the case where detector pulses occur during every wait time for the entire acquisition time. In order for the sampled baseline restore circuit to converge, the baseline must be sampled when the pulse rate is low. Therefore the inclusion of an End of Acquisition timer and a forced baseline sample occurs if the pulse rate is low. However in this example, the pulse rate, H_RATE is high. Therefor no sample will be taken during this sample period.

Figure 6D:
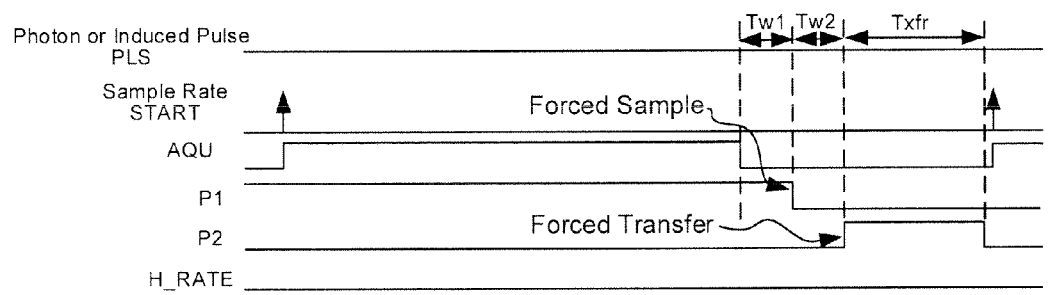

FIG. 6D is the case where the SHA baseline DC level is outside the PLS detector window. This occurs when the circuit is powered up. In order for the sampled baseline restore circuit to converge, the baseline must be sampled. Therefore the inclusion of an End of Acquisition timer and a forced baseline acquisition can occur. The acquisition occurs when the high rate detector's output is low indicating a low pulse rate.

The timing can be generated using a digital state machine, or analog/digital techniques. Generating the clock phases of FIGS. 6A, 6B, 6C and 6D requires a relatively small amount of logic and analog circuitry. The following is an example of an approach using retriggerable one-shot timers and some miscellaneous logic.

Figure 7:
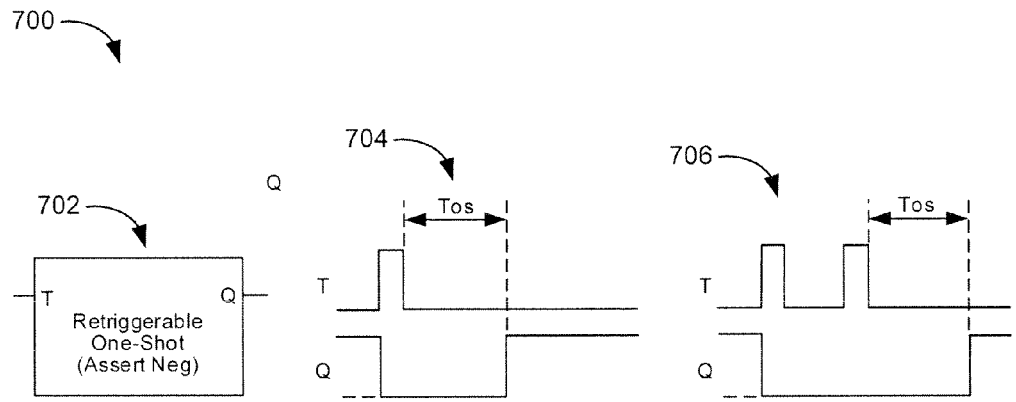
FIG. 7 shows a retriggerable one-shot and associated timing diagram according to the present invention.

The definition of a one-shot trigger circuit symbol and timing is shown in the circuit 700 of FIG. 7. The Output Q goes low when T is asserted and remains low for Tos after T is de-asserted as shown. The one-shot 700 is retriggerable as shown. FIG. 7 shows a retriggerable one-shot 702, a single-trigger event 704 and a retrigger event 706.

Figure 8:
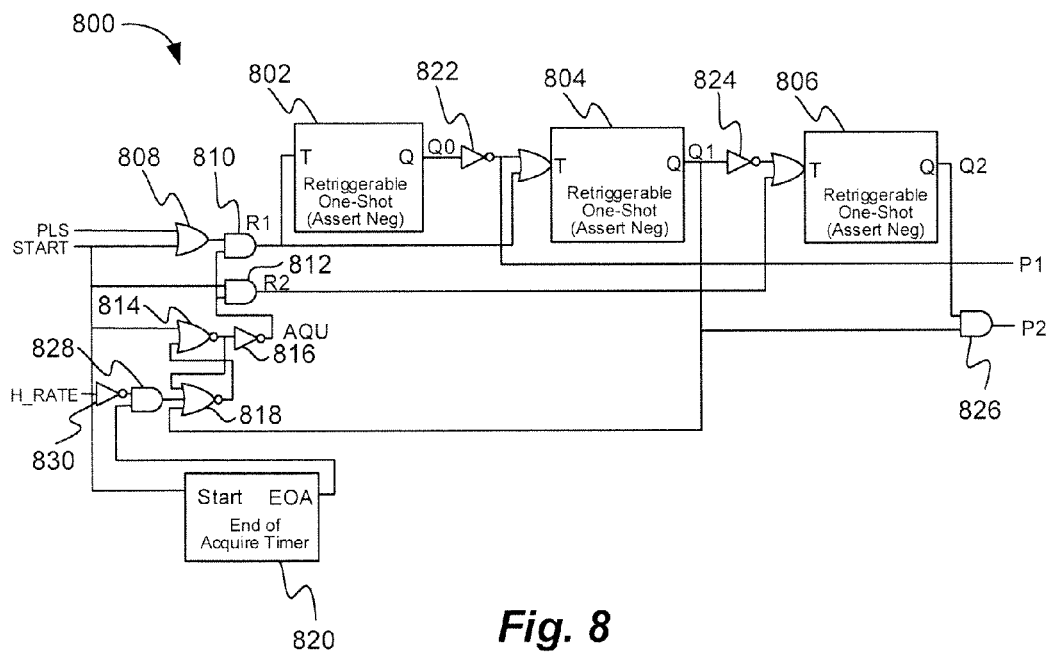
FIG. 8 shows a sample control logic circuit using one-shots and logic circuitry according to the present invention.

A possible example of the Sample Control logic is shown in the circuit 800 of FIG. 8. The start pulse triggers are all three one-shots 802, 804, and 806. Each one-shot sequentially times out and the Q outputs are used to generate P1 and P2 clocks for the switched capacitor integrator. Q0 (Tos=Tw1) is the P1 wait timer, Q1 (Tos=Tw2) is the wait before transfer timer, and Q2 (Tos=Txfr) is the transfer timer.

A detected pulse, PLS, will retrigger the first two timers controlling the P1 sampler and the wait time after sample. PLS is also gated with acquisition signal AQU. AQU is active after start until the End of Acquisition timer or a sampled transfer takes place. The acquisition S/R latch is cross coupled NOR gates that sets on start (AQU high), and resets with EOA gated by H_RATE NOT, or Q1.

Sample errors will occur due to detector pulse "tails" that are below the comparator thresholds. The sampled integrator should smooth the artifacts out. The step due to any sample should be well below the noise level of the SHA output.

Circuit 800 includes one-shot circuit 802, 804, and 806 and inverters 822 and 824. Circuit 800 also includes logic circuitry which includes logic gates 808, 810, 812, 814, 816, 818, 826, 828, and 830 as shown. Circuit 800 also includes timer 820.

Figure 9A:
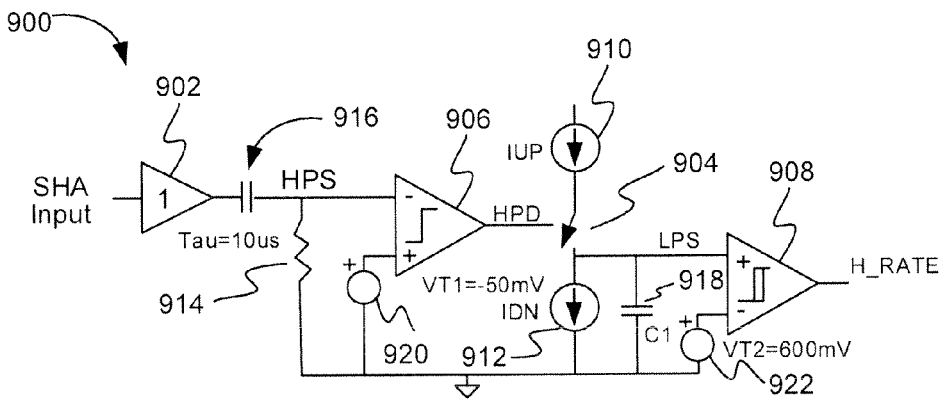
FIG. 9A shows a rate detector circuit according to the present invention.

A possible example of the High Rate Detector circuit is shown in the circuit 900 of FIG. 9A. The SHA input, 902 is from the amplifier 304 of FIG. 3. SHA is buffered, 902, and input to high pass RC filters 914 and 916, and output HPS. HPS is input to a comparator 906, with threshold voltage VT1 920, and output at HPD. HPD controls a switch 904 that connects an IUP pull-up current source 910 through the switch to input of a charge integrating capacitor C1 918. The integrating capacitor is connected to a pull down current IDN 912. LPS signal and offset threshold VT2 922 are input to comparator 908. The comparator output is H_RATE as shown in FIG. 9A.

Figure 9B:
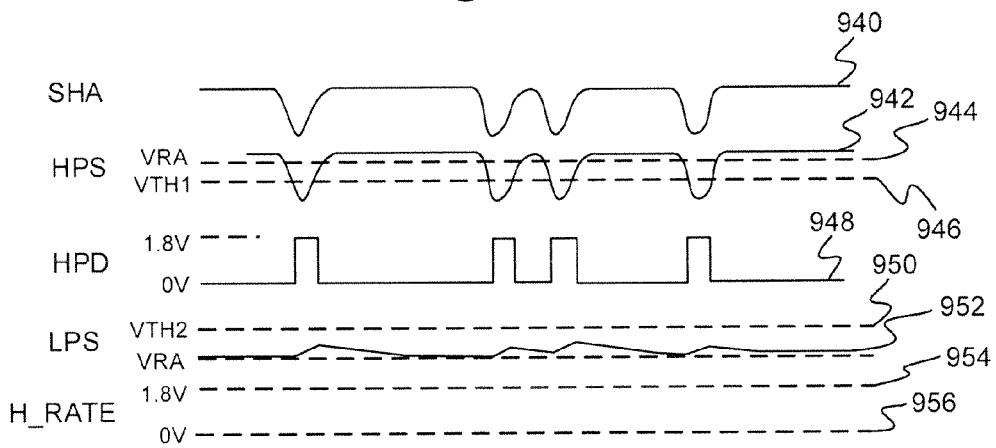
FIGS. 9B and 9C are timing diagrams associated with the rate detector of FIG. 9A.

The input SHA is buffered and high pass filtered to remove the DC value of SHA and output a signal with the average signal DC value at HPS. FIG. 9B shows the SHA input signal 940. The HPS signal 942 with DC offset VRA 944 for low rate detected pulses is shown. When comparator threshold VTH1 946 is at a higher voltage than HPS, then the comparator output HPD 948 goes high. The comparator high output, HPD, duty factor is proportional to the input SHA pulse rate assuming the detected pulse widths are approximately identical. HPS switches the current IPU to add to the integration capacitor, C1, charge with a duty factor equal that of HPS. If the HPS duty factor is higher than the IDN to IUP ratio, the voltage at LPS will integrate to the positive supply voltage. When LPS voltage goes above VTH2 950 H_RATE goes high indicating a high pulse rate. H_RATE is shown as transitioning between 0V and 1.8V (956 and 954).

FIG. 9B shows the High Rate Detector waveforms for "low" pulse rates. The LPS waveform, 952, is for a low duty factor from comparator 906. Notice that a high on HPD causes the voltage to ramp up with a high rate, and a low on HPS causes the voltage to ramp down with a slow rate.

Figure 9C:
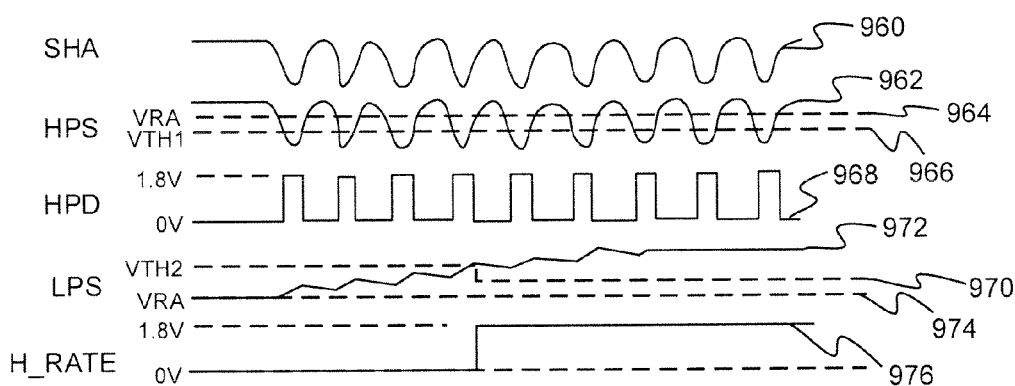

FIG. 9C shows the same waveforms as FIG. 9B but with a much higher pulse rate. SHA, 960, has many pulses close together. This results in comparator 906 having an output with a high duty cycle. The high duty cycle of the comparator output results in LPS 972 ramping high. When LPS crosses the VTH2 threshold 970, the H_RATE output 976 goes high indicating a high rate input pulse sequence; and the VTH2 threshold goes lower by a hysteresis voltage. The complete list of signals shown in FIG. 9C are: SHA 960, HPS 962, VRA 964, VTH1 966, HPD 968, VTH2 970, LPS 972, VRA 974, and H_RATE 976.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

I claim:

1. A baseline restore circuit comprising:
    a current input for receiving a current pulse having a DC current baseline;
    a charge amplifier having an input coupled to the current input, and an output referenced to a voltage baseline;
    a switched capacitor circuit having an input coupled to the output of the charge amplifier, and an output;
    an integrator circuit having an input coupled to the output of the switched capacitor circuit and an output coupled to the current input; and
    a sample control circuit configured for selectively controlling the switched capacitor circuit so that only the charge amplifier output baseline is sampled,
    wherein the switched capacitor circuit comprises a capacitor referenced to the reference voltage baseline in series with a switch that performs a sample and hold of the charge amplifier output; and a switch that transfers the sampled voltage to the integrator input.

2. The circuit of claim 1 wherein the charge amplifier comprises a current to voltage transimpedance circuit.

3. The circuit of claim 1 wherein the integrator circuit comprises a voltage integrator circuit in series with a transconductance amplifier.

4. The circuit of claim 1 wherein the sample control circuit comprises a pulse detector circuit.

5. The circuit of claim 1 wherein the sample control circuit comprises a rate detector circuit.

6. The circuit of claim 1 wherein the sample control circuit comprises sample control logic.

7. The circuit of claim 4 wherein the pulse detector circuit comprises two comparator circuits coupled in parallel.

8. The circuit of claim 4 wherein the pulse detector circuit is configured to receive a high threshold voltage and a low threshold voltage.

9. The circuit of claim 5 wherein the rate detector circuit comprises:
    a high pass filter;
    a first comparator having a threshold coupled to the high pass filter;
    a charge pump switch coupled to the comparator;
    a charge pump capacitor coupled to the charge pump switch comprising a pull down current, and a pull up current controlled by the charge pump switch; and
    a second comparator having a threshold coupled to the charge pump capacitor, wherein the second comparator output indicates a high frequency pulse rate input when high.

10. The circuit of claim 1 wherein the sample control circuit comprises a multiple-component digital logic circuit.

11. The circuit of claim 10 wherein the digital logic circuit comprises a plurality of retriggerable one-shot circuits.

12. The circuit of claim 10 wherein, if a pulse is detected a corresponding sample is discarded.

13. The circuit of claim 10 wherein, if no pulse is detected a corresponding sample is transferred to the integrator.

14. A baseline restore sampling method comprising:
   providing a current input for receiving a current pulse having a reference voltage baseline;
   providing a charge amplifier having an input coupled to the current input, and an output;
   providing a switched capacitor circuit having an input coupled to the output of the charge amplifier, and an output;
   providing an integrator circuit having an input coupled to the output of the switched capacitor circuit and an output coupled to the current input; and
   providing a sample control circuit for selectively controlling the switched capacitor circuit so that only the reference voltage baseline is sampled,
   wherein the switched capacitor circuit comprises a capacitor referenced to the reference voltage baseline in series with a sampling switch, and in series with an output switch.

15. The method of claim 14 wherein the charge amplifier is referenced to the reference voltage baseline.

16. The method of claim 14 wherein the integrator circuit comprises a variable integrator circuit in series with a transconductance amplifier.

17. The method of claim 14 wherein the sample control circuit comprises a pulse detector circuit.

18. The method of claim 14 wherein the sample control circuit comprises a rate detector circuit.

19. The method of claim 14 wherein the sample control circuit comprises sample control logic.

20. The method of claim 17 wherein the pulse detector circuit comprises two comparator circuits coupled in parallel.

21. The method of claim 17 wherein the pulse detector circuit is configured to receive a high threshold voltage and a low threshold voltage.

22. The method of claim 14 wherein the sample control circuit comprises a multiple-component digital logic circuit.

23. The method of claim 22 wherein the digital logic circuit comprises a plurality of retriggerable one-shot circuits.

24. The method of claim 14 wherein, if a pulse is detected a corresponding sample is discarded.

25. A baseline restore circuit comprising:
   a current input for receiving a current pulse having a DC current baseline;
   a charge amplifier having an input coupled to the current input, and an output referenced to a voltage baseline;
   a switched capacitor circuit having an input coupled to the output of the charge amplifier, and an output;
   an integrator circuit having an input coupled to the output of the switched capacitor circuit and an output coupled to the current input; and
   a sample control circuit configured for selectively controlling the switched capacitor circuit so that only the charge amplifier output baseline is sampled,
   wherein the sample control circuit comprises a pulse detector circuit.

26. The circuit of claim 25 wherein the pulse detector circuit comprises two comparator circuits coupled in parallel.

27. The circuit of claim 25 wherein the pulse detector circuit is configured to receive a high threshold voltage and a low threshold voltage.

* * * * *